US008655609B2

(12) United States Patent
Schweitzer, III et al.

(10) Patent No.: US 8,655,609 B2
(45) Date of Patent: Feb. 18, 2014

(54) FAULT LOCATION USING TRAVELING WAVES

(71) Applicant: Schweitzer Engineering Laboratories, Inc., Pullman, WA (US)

(72) Inventors: Edmund O Schweitzer, III, Pullman, WA (US); Armando Guzman-Casillas, Pullman, WA (US); Veselin Skendzic, East Norriton, PA (US); Mangapathirao Venkata Mynam, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 0 days.

(21) Appl. No.: 13/651,146

(22) Filed: Oct. 12, 2012

(65) Prior Publication Data

US 2013/0096854 A1 Apr. 18, 2013

Related U.S. Application Data

(60) Provisional application No. 61/546,480, filed on Oct. 12, 2011.

(51) Int. Cl.

*G01R 13/06* (2006.01)
*G01R 13/02* (2006.01)
*G01R 13/04* (2006.01)
*G01R 13/08* (2006.01)

(52) U.S. Cl.

USPC .................... 702/59; 702/57; 702/58; 702/62

(58) Field of Classification Search

USPC ......... 702/57, 58, 59, 62, 172, 183, 188, 189; 324/512; 361/601

See application file for complete search history.

(56) References Cited

U.S. PATENT DOCUMENTS 3,585,298 A 6/1971 Liberman
3,878,460 A 4/1975 Nimmersjö

(Continued)

FOREIGN PATENT DOCUMENTS

EP 0226210 6/1987
EP 0241832 7/1990

(Continued)

OTHER PUBLICATIONS

Harshad Mehta, Fault Location Techniques for High-Voltage DC Lines, EPRI EL-4331 Project 2150-1, 1985.

(Continued)

*Primary Examiner* — Sujoy Kundu
*Assistant Examiner* — Felix Suarez
(74) *Attorney, Agent, or Firm* — Jared L. Cherry; Richard M. Edge

(57) ABSTRACT

Disclosed herein are various embodiments of systems and methods for calculating a fault location in electric power delivery system based on a traveling wave created by an electrical fault in the electric power delivery system. According to one embodiment, an intelligent electronic device may be configured to detect a transient traveling wave caused by an electrical fault. A first traveling wave value of the transient traveling wave may be determined and a corresponding first time associated with the first traveling wave may be determined. The IED may receive a second time associated with a second traveling wave value of the transient traveling wave detected by a remote IED. The distance to the remote IED may be known. An estimated fault location may be generated based on the time difference between the first time and the second time. Additional methods of calculating the fault location may also be employed.

34 Claims, 11 Drawing Sheets

(56) References Cited

U.S. PATENT DOCUMENTS

| | | | | |
|---|---|---|---|---|
| 3,890,544 | A | 6/1975 | Chamia | |
| 3,956,671 | A | 5/1976 | Nimmersjö | |
| 4,053,816 | A | 10/1977 | Nimmersjö | |
| 4,254,444 | A | 3/1981 | Eriksson | |
| 4,296,452 | A | 10/1981 | Eriksson | |
| 4,351,011 | A | 9/1982 | Liberman | |
| 4,377,834 | A | 3/1983 | Eriksson | |
| 4,766,549 | A | 8/1988 | Schweitzer | |
| 4,797,805 | A | 1/1989 | Nimmersjo | |
| 4,800,509 | A | 1/1989 | Nimmersjo | |
| 5,572,138 | A | 11/1996 | Nimmersjo | |
| 5,729,144 | A | 3/1998 | Cummins | |
| 6,477,475 | B1 | 11/2002 | Takaoka | |
| 7,174,261 | B2 * | 2/2007 | Gunn et al. | 702/62 |
| 7,535,233 | B2 | 5/2009 | Kojovic | |
| 7,733,094 | B2 * | 6/2010 | Bright et al. | 324/512 |
| 2002/0165462 | A1 | 11/2002 | Westbrook | |
| 2006/0012374 | A1 | 1/2006 | Kojovic | |
| 2008/0077336 | A1 * | 3/2008 | Fernandes | 702/57 |
| 2009/0230974 | A1 | 9/2009 | Kojovic | |

FOREIGN PATENT DOCUMENTS

| | | |
|---|---|---|
| EP | 0164711 | 12/1991 |
| EP | 0244649 | 4/1992 |
| GB | 1463755 | 2/1977 |
| WO | 9519060 | 7/1995 |
| WO | 2010099585 | 9/2010 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Elhaffar, Power Transmission Line Fault Location Based on Current Traveling Waves. TKK Dissertations 107, Espoo 2008, Helsinki University of Technology. Department of Electrical Engineering, Dec. 2008.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, Feb. 5, 2013.

* cited by examiner

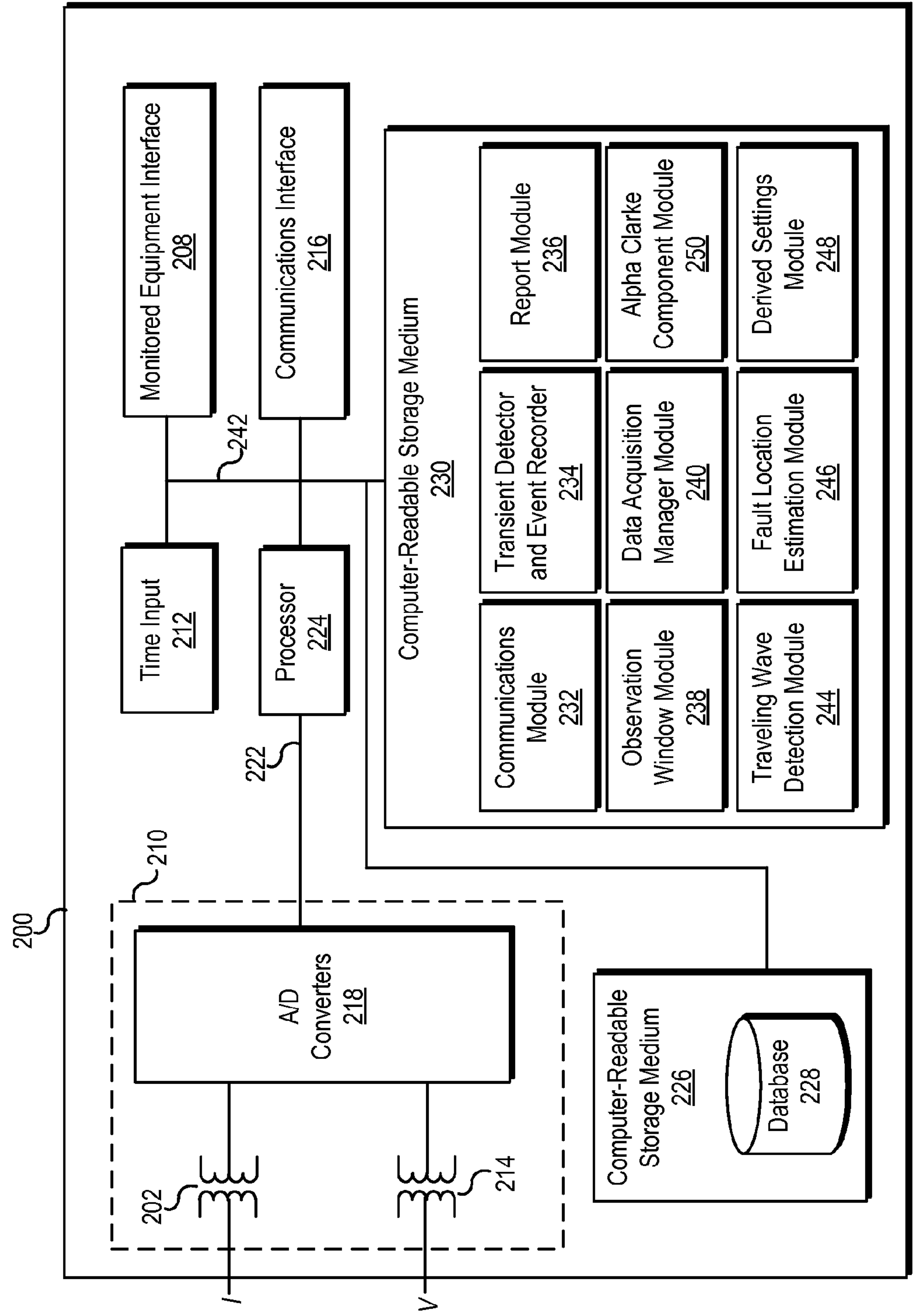

Figure 2
200
210
202
214
I
V
A/D Converters 218
222
Time Input 212
Processor 224
242
Monitored Equipment Interface 208
Communications Interface 216
Computer-Readable Storage Medium 230
Communications Module 232
Transient Detector and Event Recorder 234
Report Module 236
Observation Window Module 238
Data Acquisition Manager Module 240
Alpha Clarke Component Module 250
Traveling Wave Detection Module 244
Fault Location Estimation Module 246
Derived Settings Module 248
Computer-Readable Storage Medium 226
Database 228

700

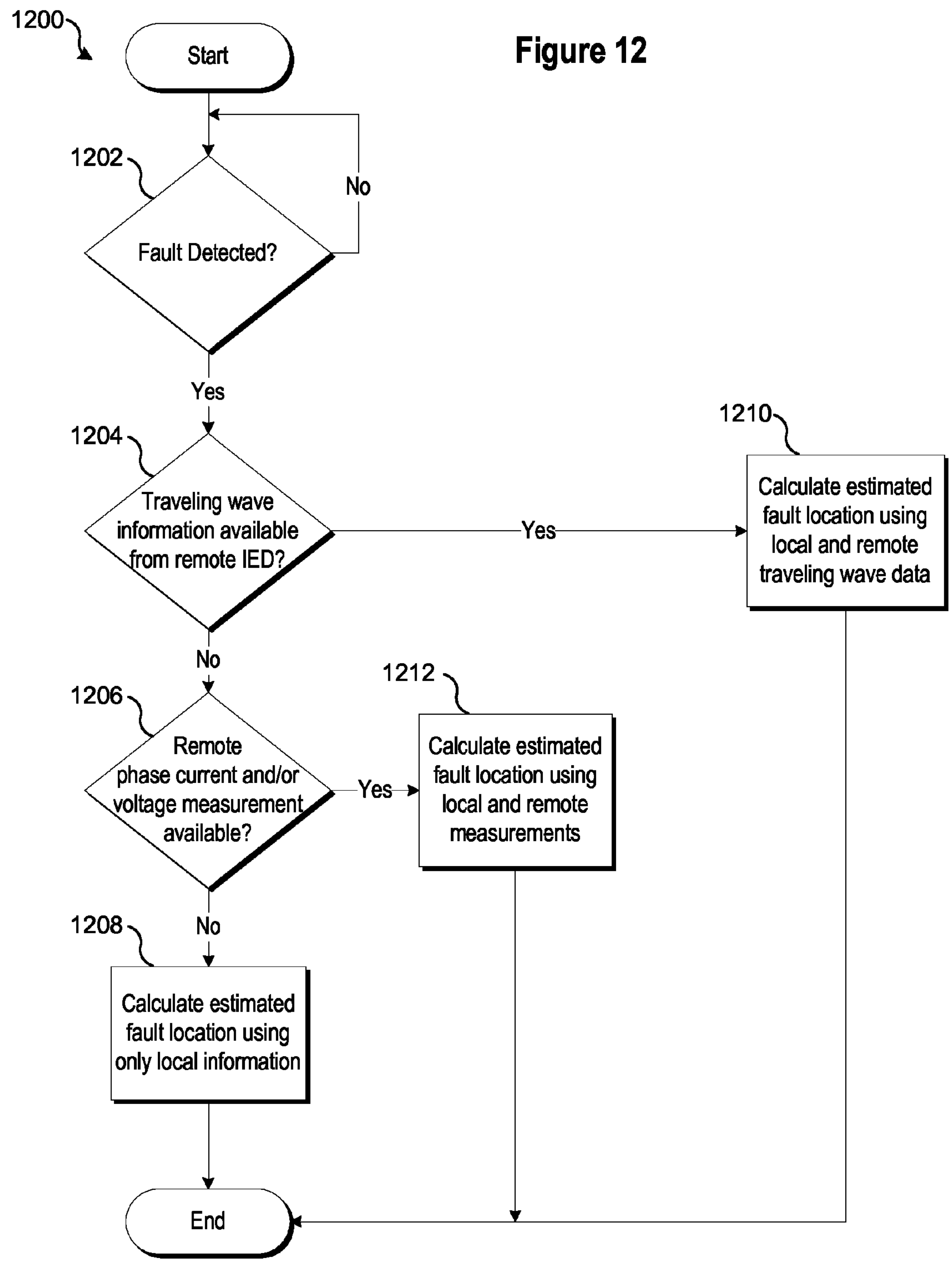

1200
Start
Figure 12
1202
Fault Detected?
No
Yes
1204
Traveling wave information available from remote IED?
Yes
1210
Calculate estimated fault location using local and remote traveling wave data
No
1206
Remote phase current and/or voltage measurement available?
Yes
1212
Calculate estimated fault location using local and remote measurements
No
1208
Calculate estimated fault location using only local information
End

FAULT LOCATION USING TRAVELING WAVES

RELATED APPLICATIONS

This application claims priority under 35 U.S.C. §119(e) to U.S. Provisional Patent Application No. 61/546,480, filed Oct. 12, 2011, and titled "Fault Location in Real-Time Using Traveling Waves," which is incorporated herein by reference in its entirety.

TECHNICAL FIELD

This disclosure relates to detecting a transient wave and calculating fault location. More particularly, this disclosure relates to calculating fault location in real time based on a detected transient wave.

BRIEF DESCRIPTION OF THE DRAWINGS

Non-limiting and non-exhaustive embodiments of the disclosure are described, including various embodiments of the disclosure with reference to the figures, in which:

FIG. 2 illustrates a functional block diagram of an intelligent electronic device for calculating a fault location according to certain embodiments.

FIG. 12 illustrates a flowchart of a method for selecting one method for estimating the location of a fault from a plurality of available methods according to certain embodiments.

DETAILED DESCRIPTION

Figure 1:
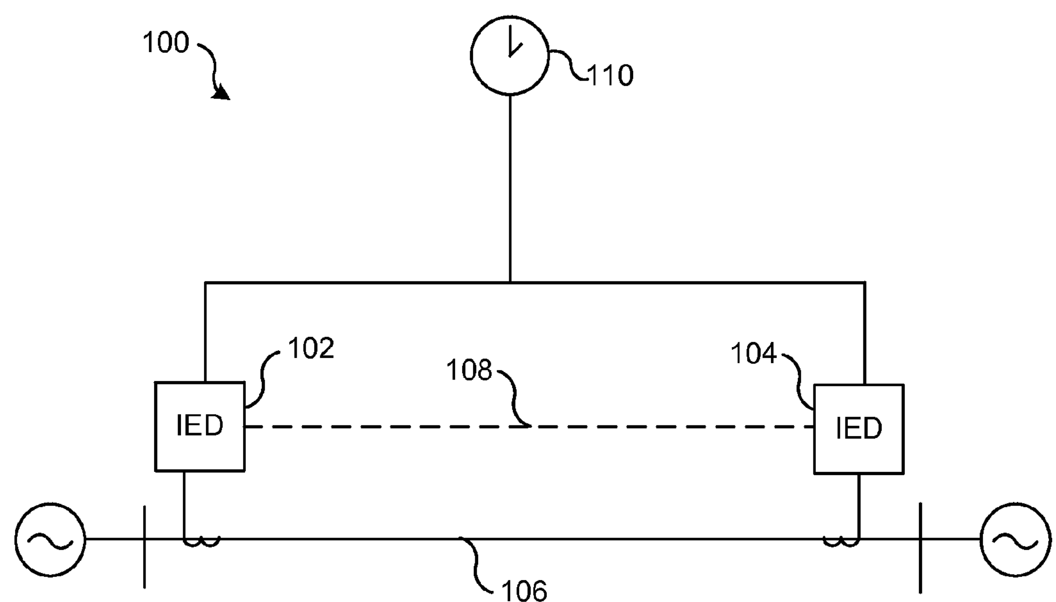
FIG. 1 illustrates a block diagram of a system for detecting a traveling wave and calculating a location of a fault using the detected traveling wave according to certain embodiments.

Traveling wave fault location (TWFL) systems are commercially available in dedicated fault location equipment or as an additional function included in certain digital fault recorders. Some electrical utilities in Canada and the USA use TWFL systems developed within the utility for internal use and may not be commercially available. Today TWFL systems normally provide fault location information in a post-mortem fashion by analyzing current or voltage oscillograms—also known as event reports—from the fault. The fault location can be estimated using oscillograms from one terminal or all terminals of the transmission line. Multiple terminal TWFL systems use current or voltage samples with their corresponding time stamps according to the Coordinated Universal Time (UTC) time to simplify calculations. These systems obtain the events from transmission line terminals and use a general purpose computer that runs software to determine a location of the fault.

Today, most line protective relays provide fault location estimation in real time using impedance-based algorithms. These algorithms use local voltage and current information and/or current and voltage information from the remote terminals. When using information from both terminals, the accuracy of the impedance-based fault location estimation can be within 1.5% of the line length. In most applications this accuracy is sufficient to promptly locate faults in lines with lengths of 20 mi or less. This accuracy may not be sufficient, however, for long lines (e.g., 150 mi length or longer). Therefore, a utility may elect to use a dedicated TWFL system. The accuracy of a TWFL system is not necessarily a function of line length and is typically within ±0.2 mi. TWFL systems are also suitable for series compensated lines while impedance-based fault location algorithms are not, additionally, impedance-based fault location methods are challenged during fast clearing faults. For the above reasons, there is a need in the industry for protective relays with built-in TWFL capability.

One of the limitations of TWFL systems is that when fault inception angle at the fault location is zero, no detectable traveling wave activity is recorded at the transmission line terminals. In these circumstances, the impedance-based fault location methods which exist in modern microprocessor based protective relays can still locate the fault. Accordingly, in order to gather data regarding a traveling wave, continuous recording may be employed. According to some embodiments, including a TWFL system may be incorporated into a protective relay that continuously records traveling wave data on a transmission line. Another benefit that may be realized, according to some embodiments disclosed herein, is that the fault location is calculated only when there is an internal line fault, thereby avoiding nuisance fault location results when traveling waves are detected due to switching transients and external faults. An additional benefit that may be realized is that the protective relay can be applied to terminals with double breakers and provide fault location information when one of the breakers is out of service.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system data bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic and/or processor executable instructions.

FIG. 1 illustrates a block diagram of a system 100 for detecting a traveling wave and calculating a location of a fault using the detected traveling wave according to certain embodiments. FIG. 1 illustrates an electric power delivery system 100 that may include generation, transmission, distribution or similar systems. System 100 includes a conductor 106 such as a transmission line connecting two nodes. Although illustrated in single-line form for purposes of simplicity, system 100 may be a multi-phase system, such as a three-phase electric power delivery system. System 100 is monitored by IEDs 102 and 104 at two locations of the system, although further IEDs may also be utilized to monitor further locations of the system.

IEDs 102 and 104 may obtain electric power system information using current transformers (CTs), potential transformers (PTs), Rogowski coils, and/or the like. IEDs 102 and 104 may receive common time information from a common time source 110. According to one embodiment, IEDs 102 and 104 may be embodied as line current differential relays (e.g., Model No. SEL-411L available from Schweitzer Engineering Laboratories (SEL) of Pullman, Wash.).

Common time source 110 may be any time source capable of delivering a common time to each of IEDs 102 and 104. Some examples of a common time source include a Global Navigational Satellite System ("GNSS") such as the Global Positioning System ("GPS") system delivering a time signal corresponding with IRIG, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED may be in communication with a separate clock, such as a satellite-synchronized clock, with each clock providing each IED with a common time signal. The common time signal may be derived from a GNSS system or other time signal.

A data communication channel 108 may allow IEDs 102 and 104 to exchange information relating to, among other things, traveling waves. According to some embodiments, a time signal based on common time source 110 may be distributed to IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data. According to one specific embodiment, communication channel 108 may be embodied as a 64 kbps bidirectional communication channel. In further embodiments, data communication channel 108 may be a wireless communication channel (e.g., a radio communication channel) utilizing any suitable wireless communication protocol.

FIG. 2 illustrates a functional block diagram of an IED 200 for calculating a fault location according to certain embodiments. IED 200 includes a communications interface 216 configured to communicate with other IEDs and/or system devices. In certain embodiments, the communications interface 216 may facilitate direct communication with another IED or communicate with another IED over a communications network. Communications interface 216 may facilitate communications with multiple IEDs. IED 200 may further include a time input 212, which may be used to receive a time signal (e.g., a common time reference) allowing IED 200 to apply a time-stamp to the acquired samples. In certain embodiments, a common time reference may be received via communications interface 216, and accordingly, a separate time input may not be required for time-stamping and/or synchronization operations. One such embodiment may employ the IEEE 1588 protocol. A monitored equipment interface 208 may be configured to receive status information from, and issue control instructions to, a piece of monitored equipment (such as a circuit breaker, conductor, transformer, or the like).

Processor 224 may be configured to process communications received via communications interface 216, time input 212, and/or monitored equipment interface 208. Processor 224 may operate using any number of processing rates and architectures. Processor 224 may be configured to perform various algorithms and calculations described herein. Processor 224 may be embodied as a general purpose integrated circuit, an application specific integrated circuit, a field-programmable gate array, and/or any other suitable programmable logic device.

In certain embodiments, IED 200 may include a sensor component 210. In the illustrated embodiment, sensor component 210 is configured to gather data directly from a conductor (not shown) and may use, for example, transformers 202 and 214 and A/D converters 218 that may sample and/or digitize filtered waveforms to form corresponding digitized current and voltage signals provided to data bus 222. A/D converters 218 may include a single A/D converter or separate A/D converters for each incoming signal. A current signal may include separate current signals from each phase of a three-phase electric power system. Further, if IED 200 is configured to monitor two breakers, the current signal may include six current signals, that is, one from each phase of each breaker.

A/D converters 218 may be connected to processor 224 by way of data bus 222, through which digitized representations of current and voltage signals may be transmitted to processor 224. In various embodiments, the digitized current and voltage signals may be used to calculate the location of a fault on an electric power line as described herein.

A computer-readable storage medium 226 may be the repository of a database 228 containing electric power line properties for each section, such as impedances, resistances, propagation times, reactances, lengths, and/or the like. Another computer-readable storage medium 230 may be the repository of various software modules configured to perform any of the methods described herein. A data bus 242 may link monitored equipment interface 208, time input 212, communications interface 216, and computer-readable storage mediums 226 and 230 to processor 224.

Computer-readable storage mediums 226 and 230 may be the same medium (i.e. the same disk, the same non-volatile memory device, or the like) or separate mediums as illustrated. Further, the database 228 may be stored in a computer-readable storage medium that is not part of the IED 200, but that is accessible to the processor using, for example, a data bus, a computer network, or the like.

Transient detector and event recorder 234 may collect data samples of a traveling wave current. According to one embodiment, the data samples may be stored in a circular buffer. The data samples may be associated with a timestamp and made available for retrieval. Certain embodiments of a transient detector may include a transient detector and event recorder 234 as illustrated and described in connection with FIG. 6. Traveling waves are measured and recorded in real-time, since they are transient signals that dissipate rapidly in an electric power delivery system.

Data acquisition manager module 240 may operate in conjunction with transient detector and event recorder 234. Data acquisition manager module 240 may control recording of data relating to a travelling wave. According to one embodiment, data acquisition manager module 240 may selectively retrieve data from a circular buffer comprised by transient detector and event recorder 234, and may make the data available for further processing and storage.

Derived settings module 248 may be configured to determine a variety of parameters associated with the determination of a fault location using traveling waves. These parameters may include the following:

| | |
|---|---|
| LPVEL | line propagation velocity in per-unit of the speed of light |
| LL | line length |
| LLUNIT | line length units (e.g., miles, kilometers) |
| SCBL | secondary cable length (e.g. yards, meters) |
| MAXTT | traveling wave maximum travel time |
| VLINE | propagation velocity in physical units (e.g., miles per second, kilometers per second) |
| SCBLDLY | secondary cable travelling wave delay |

IED 200 may utilize these values in order to estimate the location of a fault in an electric power delivery system. The parameters LPVEL, LL, and SCBL may be used to calculate a distance to a fault location associated with a traveling wave relative to a reference location. Further, the parameter SCBLDLY may be used to compensate for the delay of the travelling wave attributed to a secondary cable from a CT to a relay configured to detect traveling waves. The parameter MAXTT may be used to determine a size of an observation window for fault location estimation. The relationships among the parameters may be expressed, according to one embodiment, according to Eq. 1.

If $LLUNIT=km$ $VLINE=LPVEL\cdot c_{km}$ else $VLINE=LPVEL\cdot c_{mi}$ where $c_{km}=299792.458$ km/s $c_{mi}=186282.397$ mi/s    Eq. 1

The parameter MAXTT may be used by a TWFL system to set boundaries associated with observation windows that starts upon the detection of a traveling wave and ends after the maximum travel time of a traveling wave in a particular length of line. Accordingly, the parameter MAXTT may be expressed according to Eq. 2.

$$MAXTT = \frac{LL}{VLINE} \quad \text{Eq. 2}$$

According to various embodiments, a secondary cable may be used to connect a current transformer to IED 200. In order to provide a more accurate estimate of the location of a fault resulting in a traveling wave, the delay associated with a secondary cable may be calculated using Eq. 3.

If $LLUNIT = \text{km}$    Eq. 3

$$SCBLDLY = \frac{SCBL}{1000\cdot VSCBL\cdot c_{km}}$$

else $$SCBLDLY = \frac{SCBL}{1760\cdot VSCBL\cdot c_{mi}}$$

where VSCBL is the propagation velocity of the secondary cable in per-unit of speed of light. In one embodiment VSCBL can be 0.7.

Traveling wave detection module 244 may implement an algorithm for detecting traveling wave values (e.g., polarities, peak amplitudes, slopes, wave arrival, and the like) associated with a traveling wave. According to one embodiment, the traveling wave detection module 244 detects a peak of a traveling wave using a peak detection algorithm that may analyze each element of data in a fixed length vector by comparing each data element to its temporally neighboring values. A minimum threshold may be established in order to avoid false positive detections. If an element of data is larger than both of its neighbors or equals infinity and if the value is greater than the minimum threshold, the sample may be considered a local peak. Absolute values of each element of data may be used to detect a peak such that both positive and negative peaks may be detected. A peak detection data flag may be set to zero if no peaks are found. The peak detection data flag may be set to one if a peak value satisfying the criteria is found. According to one embodiment, the fixed length vector may represent 10 ms. According to another embodiment, the fixed length vector may represent 30 ms.

Traveling wave detection module 244 may implement an algorithm for detecting an arrival associated with a traveling wave. The arrival may be the time that an absolute value of a data element exceeds a predetermined threshold. Alternatively, the traveling wave detection module 244 may detect a traveling wave as a time when the elements of data reach a predetermined slope.

According to one embodiment, Alpha Clarke component module 250 may generate Alpha Clarke currents that are utilized in connection with an algorithm implemented by traveling wave detection module 244. Alpha Clarke component module 250 may remove the zero-sequence current from the phase currents. Alpha Clarke component module 250 may be configured to calculate Alpha Clarke currents in a three-phase power system using the Eq. 4.

$$TWI0S = \frac{1}{3}(TWIAS + TWIBS + TWICS) \qquad \text{Eq. 4}$$

$$TWIaA = TWIAS - TWI0S$$

$$TWIaB = TWIBS - TWI0S$$

$$TWIaC = TWICS - TWI0S$$

According to some embodiments, traveling wave detection module 244 may compensate the time stamp that corresponds to the traveling wave values to accommodate for the secondary cable delay (SCBLDLY), as set forth in Eq. 5.

$$TPK\phi = TPK\phi - SCBLDLY, \qquad \text{Eq. 5}$$

where, $\phi$ represents phases A, B, and C

Communications module 232 may be configured to allow IED 200 to communicate with any of a variety of external devices via communications interface 216. Communications module 232 may be configured for communication using a variety of data communication protocols (e.g., Ethernet, IEC 61850, etc.).

Figure 10:
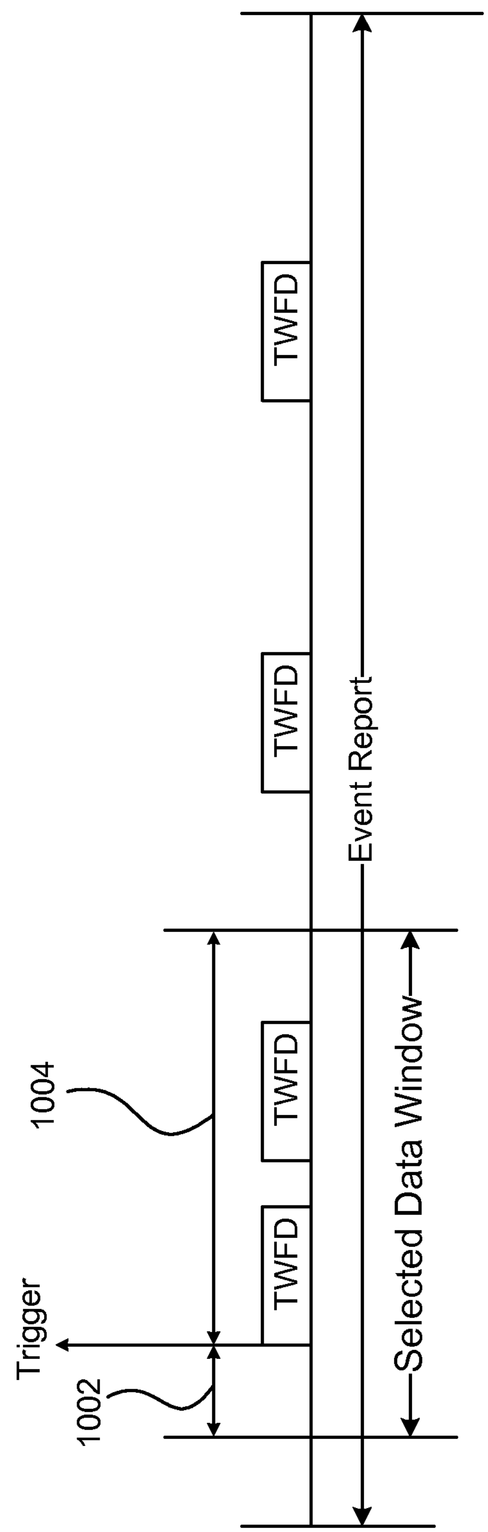
FIG. 10 illustrates a timing diagram illustrating an observation window according to certain embodiments.

Observation window module 238 may be configured to determine an observation window optimized for fault location estimation and based on whether a traveling wave has been detected. Observation window module 238 may rely on the derived parameter MAXTT in order to determine an appropriate length of time for an observation window. FIG. 10 illustrates one embodiment of an observation window, and additional discussion regarding the observation window is included below.

Report module 236 may be configured to generate a variety of reports relating to, among other things, the detection of traveling waves and the location of electrical faults causing such traveling waves. Report module 236 may be automated, according to various embodiments, such that event reports relating to faults detected by IED 200 are automatically generated. Further, report module 236 may operate in conjunction with communications module 232 in order to transmit such ports to appropriate personnel responsible for the operation of an affected electrical power delivery system.

According to one embodiment, report module 236 may be configured to create a COMTRADE file according to IEEE C37.111-1999 that includes the high frequency content of the phase currents with their corresponding time stamps. A COMTRADE file may also include fault detection information, traveling wave phase currents, and/or various derived parameters.

Fault location estimation module 246 may be configured to estimate a fault location based upon analysis of data regarding traveling waves. According to various embodiments, fault location estimation module 246 may rely on one or more approaches for calculating the location of a fault. Fault location estimation module 246 may be configured to rely on fault detection techniques, including: detection of traveling waves resulting in a fault, fault location based on impedance measurements from two points located on opposite sides of the fault, and fault location based on electrical parameters that may be measured from only one location. It may be advantageous to calculate a fault location based upon the detection of traveling waves, and accordingly, this approach may be prioritized single-ended or double ended impedance-based techniques for fault location.

According to one embodiment, fault location estimation module 246 may comprise three sub-modules: a traveling wave fault location estimation module, a two-ended fault location estimation module, and a single-ended fault location estimation module. One of these three sub-modules may be utilized to calculate an estimated fault location based upon the type of data available for a specific fault. For example, if sufficient information is available, traveling wave fault location estimation module may be selected to generate an estimated fault location. If traveling wave information is not available, but a remote phase current and/or phase voltage measurements from a remote IED are available, the two-ended-based fault location estimation module may be selected to generate the estimated fault location. Finally, if neither traveling wave information nor measurements from the remote IED are available, the single-end fault location estimation module may calculate the estimated fault location based on electrical parameters that may be measured from only one location in the electric power system.

Figure 3:
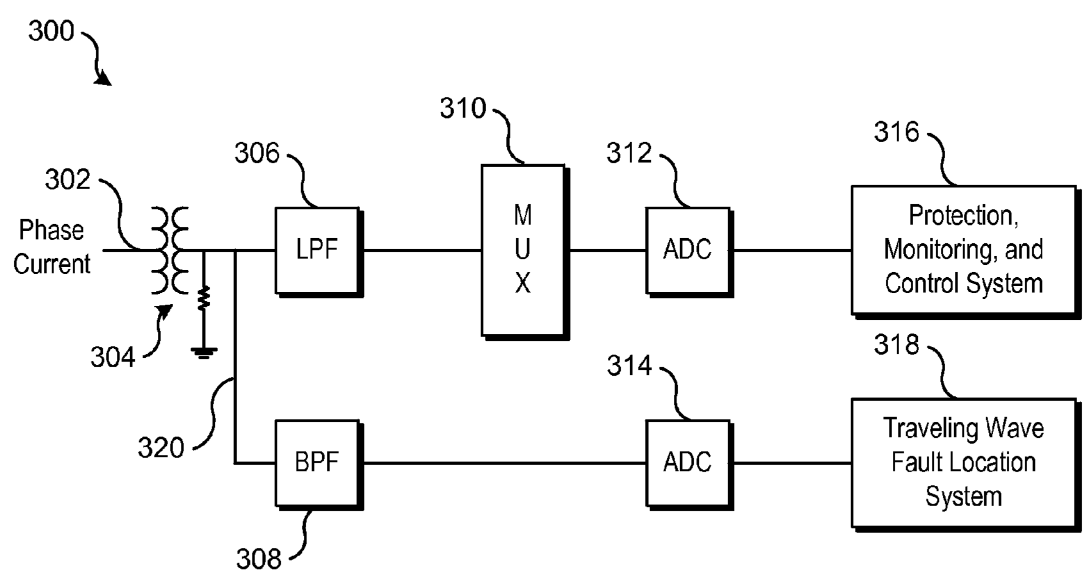
FIG. 3 illustrates a functional block diagram of a phase current data acquisition system according to certain embodiments.

FIG. 3 illustrates a functional block diagram of a phase current data acquisition system 300 according to certain embodiments. Phase current data acquisition system 300 may, according to various embodiments, be associated with or incorporated into an IED (not shown). Phase current data acquisition system 300 may, according to various embodiments, monitor all phase currents for protection with a single multiplexer and for traveling wave fault location with a dedicated analog-to-digital converter for each channel. A single conductor 302 is illustrated. Conductor 302 is connected to one side of transformer 304. A conductor 320 may be connected to the other side of transformer 304 and may also be connected to a low-pass filter (LPF) 306 and a band-pass filter (BPF) 308. According to one embodiment, LPF 306 filter may have a bandwidth of 3 kHz, while BPF 308 may have a bandwidth of 10 kHz-600 kHz. According to one embodiment, BPF 308 may be replaced by a combination of analog and digital filters. Analog-to-digital converters (ADC) 312, 314 may be connected to protection, monitoring, and control (PMC) system 316 and TWFL system 318, respectively. According to one embodiment, ADC 312 may sample the currents at 8 kHz while ADC 314 may sample the currents at 1.5625 Mhz. The data sampling rate may influence the accuracy of a TWFL system (e.g., TWFL system 318).

PMC system 316 may encompass a variety of systems designed to protect, monitor, and/or control at least a portion of an electric power delivery system. PMC system 316 may receive as one input information from phase current data acquisition system 300. In response to such information, PMC system 316 may issue control instructions to one or more pieces of monitored equipment in order to maintain safe and reliable operation of the electric power delivery system. PMC system 316 may comprise a variety of disparate systems and devices, including a plurality of IEDs and monitored equipment.

TWFL system 318 may comprise a variety of systems configured to detect traveling waves and to determine a fault location using the detected traveling waves. According to one embodiment, TWFL system 318 may comprise a local IED, a remote IED, and a communication system permitting communication between the local IED and the remote IED. Each of the local IED and the remote IED may be configured to monitor an electrical transmission line for traveling waves. Upon the detection of a traveling wave, the local IED and the remote IED may exchange information regarding information gathered relating to the traveling wave in order to generate an estimate of a location of a fault that caused the traveling wave.

Figure 4:
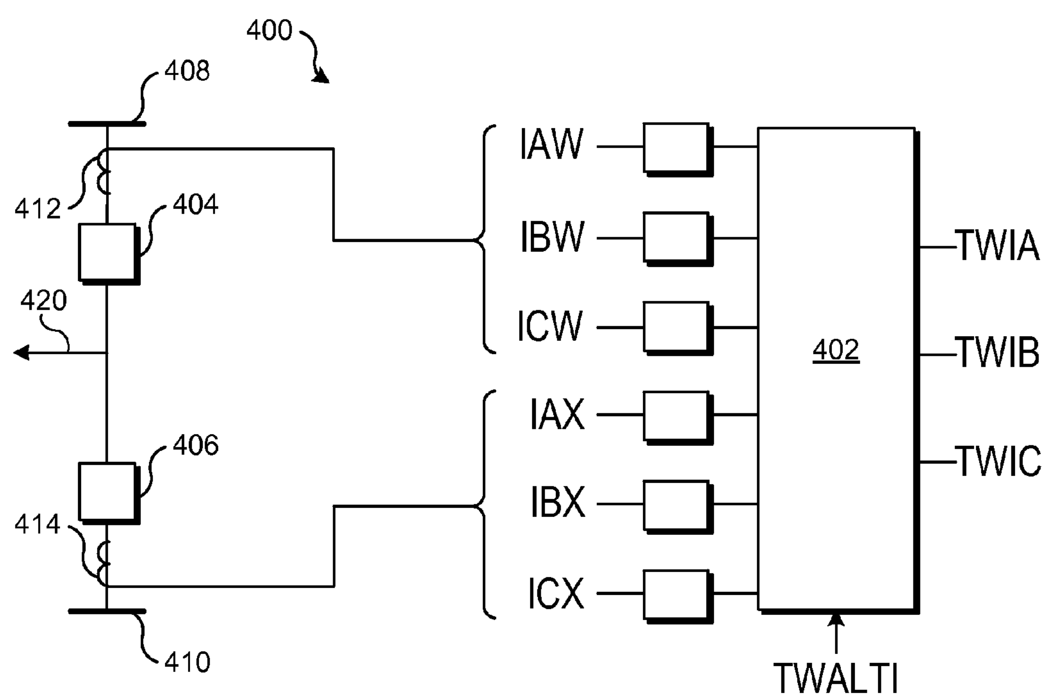
FIG. 4 illustrates a block diagram of a current source selection system that may be used in connection with various systems and methods disclosed herein for determining the location of a fault in an electric power delivery system using traveling waves.

FIG. 4 illustrates a block diagram of a current source selection system 400 that may be used in connection with various systems and methods disclosed herein for determining the location of a fault in an electric power delivery system using traveling waves. According to the illustrated embodiment, a relay 402 is configured to monitor six current channels for traveling waves. The six current channels include two sets of three-phase currents, namely, the IW set (IAW, IBW, and ICW) and the IX set (IAX, IBX, and ICX). As illustrated, relay 402 may be configured to monitor breakers 404 and 406 on a transmission line 420 between buses 408 and 410. Breaker 404 may be associated with the IW set of currents, while breaker 406 may be associated with the IX set of currents. Breakers 404, 406 may be utilized in order to prevent current from flowing through transmission line 420. Alternative embodiments may include more or fewer current channels. Further, in certain embodiments, only one phase of a three-phase power system may be monitored for traveling waves.

According to the illustrated embodiment, relay 402 uses a Boolean variable TWALTI to select the IW or the IX current set. If TWALTI=1, the source selection logic selects IX. If TWALTI=0, the source selection logic selects IW. For example, the relay uses the proper set currents for TWFL if one of the breakers 404, 406 is out of service. The relationship between the inputs (e.g., IAW, IBW, ICW, IAX, IBX, and ICX) and the outputs (e.g., TWIA, TWIB, and TWIC) of relay 402 may be expressed according to the following algorithm:

```
If TWALTI = 1
    TWIA = IAX, TWIB= IBX, and TWIC= ICX
else
    TWIA = IAW, TWIB= IBW, and TWIC= ICW
end
```

According to alternative embodiments, additional outputs may be provided so that multiple current sets may be simultaneously monitored.

Figure 5:
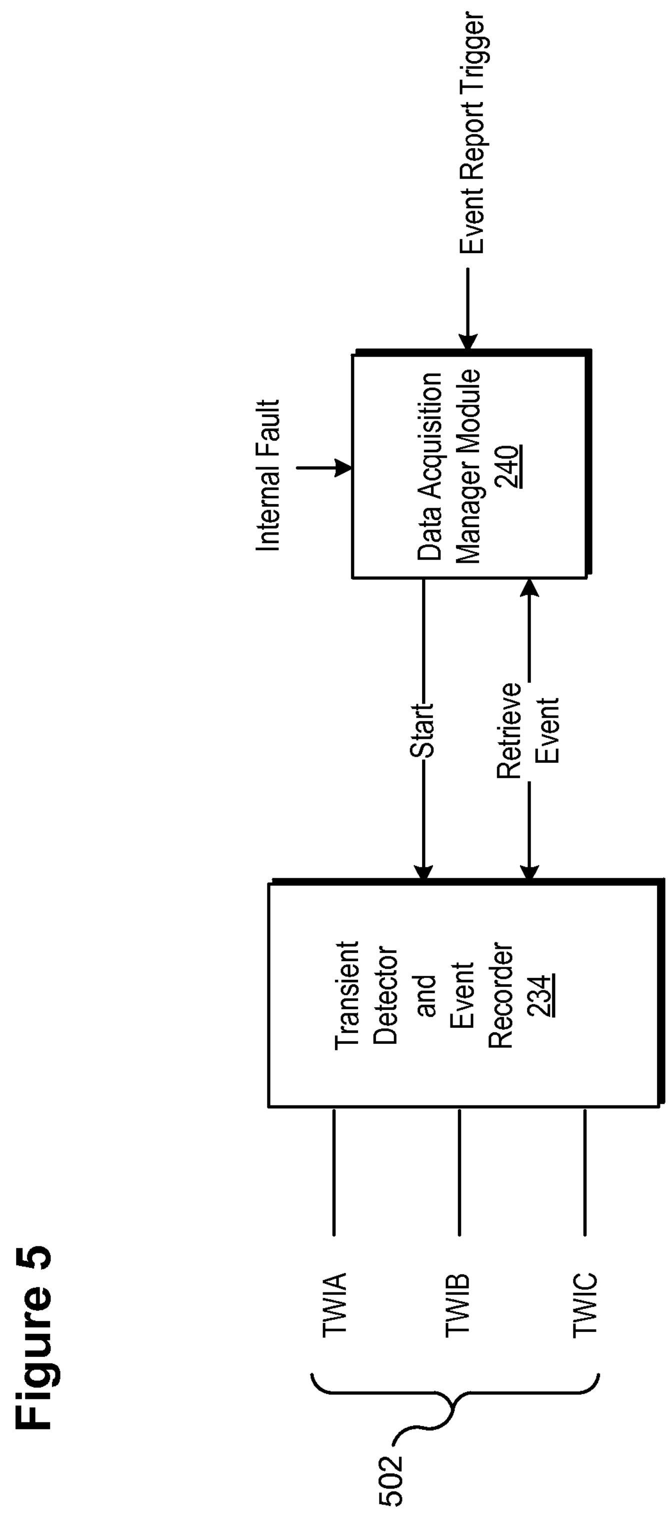
FIG. 5 illustrates a functional block diagram illustrating an interaction between a transient detector and event recorder and a data acquisition manager module according to certain embodiments.

FIG. 5 illustrates a functional block diagram showing an interaction between transient detector and event recorder 234 and data acquisition manager module 240 according to certain embodiments. Transient detector and event recorder 234 collects the data samples representing the travelling wave current inputs 502 (i.e., TWIA, TWIB, and TWIC). Transient detector and event recorder 234 may store the data samples in a rotating buffer when the data acquisition manager module sets the start bit to “1”. The transient detector and event recorder 234 may stop recording and make the stored current values and time stamp available for retrieval.

Figure 6:
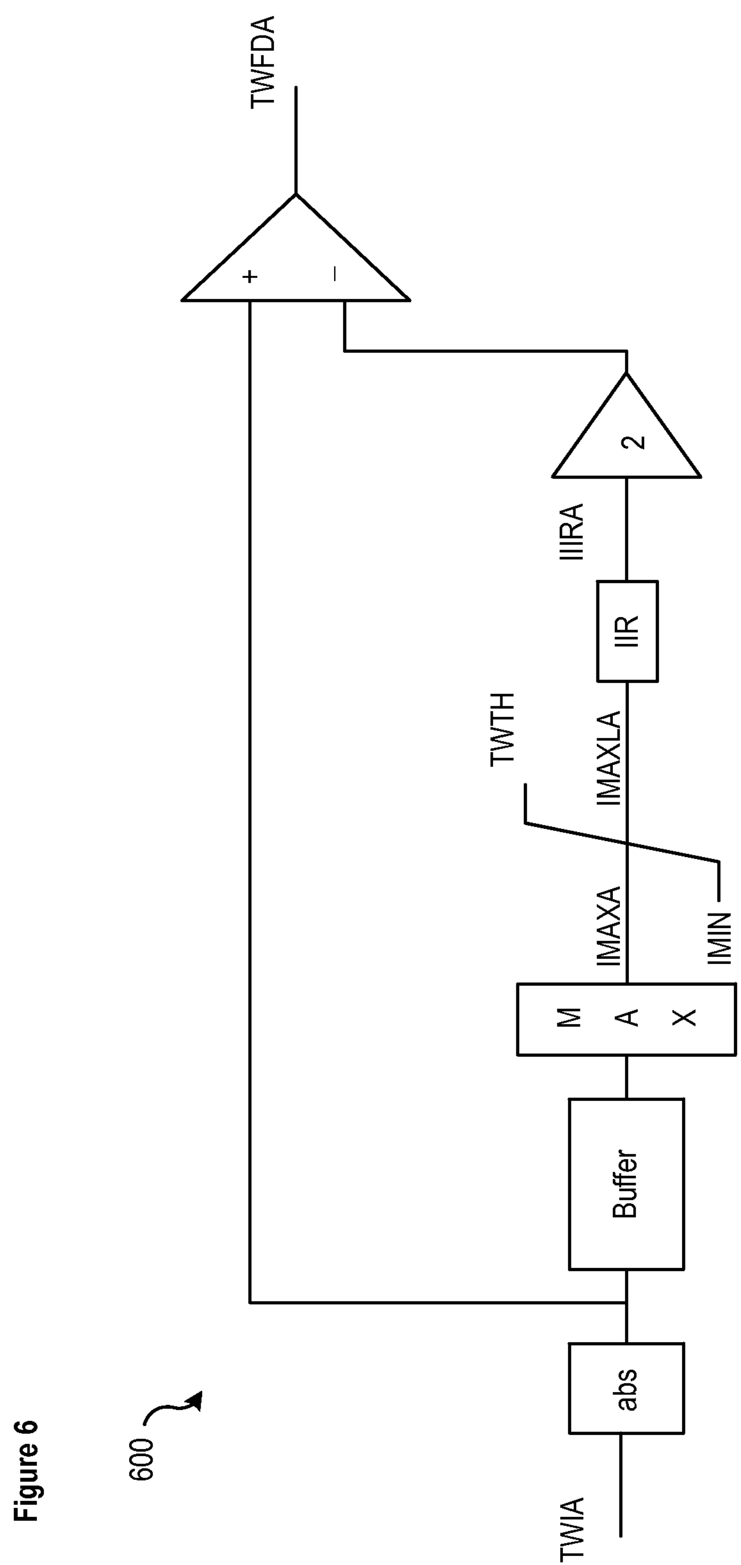
FIG. 6 illustrates a block diagram of an adaptive transient detector that may be used in connection with various systems and methods disclosed herein for determining the location of a fault in an electric power delivery system using traveling waves.

FIG. 6 illustrates a block diagram of an adaptive transient detector 600 that may be used in connection with various systems and methods disclosed herein for determining the location of a fault in an electric power delivery system using traveling waves according to certain embodiments. Transient detector 600 may adapt to the system load and noise conditions to detect travelling waves on the transmission line. The detector 600 may have a minimum threshold, TWTH, which may depend on the system noise level. A transient detector bit, TWFDA, may assert when a transient occurs on the TWIA current. The embodiment illustrated in FIG. 6 shows a single phase; however, a similar transient detector 600 may be employed for each phase in a multi-phase system. According to one embodiment, the output bit associated with a plurality of transient detectors associated with multiple phases may represent an OR combination of individual transient detectors.

Figure 7:
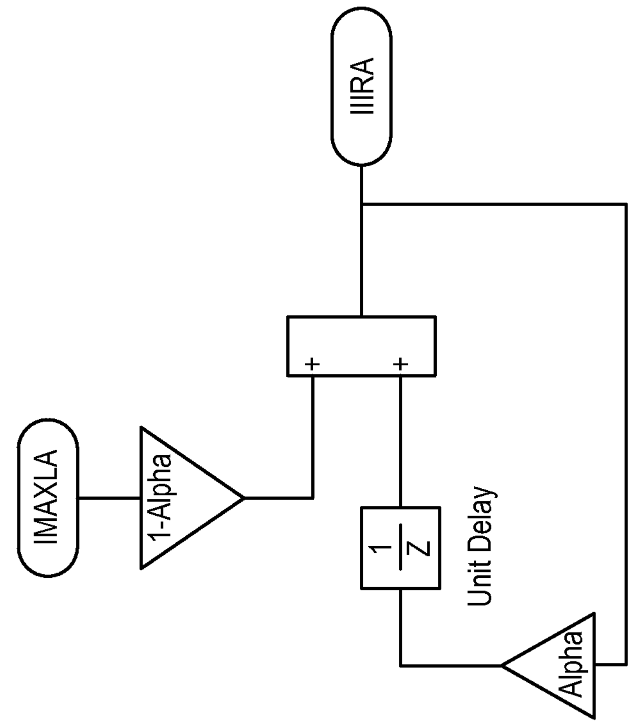
FIG. 7 illustrates a block diagram of an infinite impulse response filter that may be used in connection with various systems and methods disclosed herein for determining the location of a fault in an electric power delivery system using traveling waves.

Transient detector 600 may incorporate a first order infinite impulse response (IIR) filter. FIG. 7 illustrates a block diagram of an example of an IIR filter 700 that may be used in connection with various systems and methods disclosed herein for determining the location of a fault in an electric power delivery system using traveling waves. IIR filter 700 may, according to one embodiment, have the characteristics expressed in Eq. 8.

$$IIIRA_k = \text{Alpha} \cdot IIIRA_{k-1} + (1 - \text{Alpha}) \cdot IMAXLA_k; \quad \text{Eq. 8}$$

$$\text{Alpha} = e^{-\frac{1}{fs} \cdot \frac{1}{\tau}};$$

where $$fs = 1.5625 \text{ MHz}$$

$$\tau = 3 * 10^{-3} \text{ seconds}$$

Figure 8:
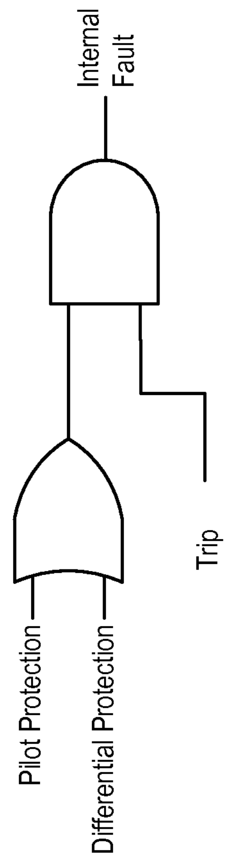
FIG. 8 illustrates a logic diagram that may be used to determine if an electric power delivery system fault occurs on a transmission line protected by various systems and methods disclosed herein.

FIG. 8 illustrates a logic diagram that may be used to determine if an electric power delivery system fault lies within a transmission line protected by various systems and methods disclosed herein. According to various embodiments, an IED may be configured to act as a protective relay, in addition to monitoring a transmission line for traveling waves. A TWFL system may be configured according to one embodiment to perform fault location calculations only when there is a trip because of differential or pilot protection element operation for an in-zone transmission line fault.

Figure 9:
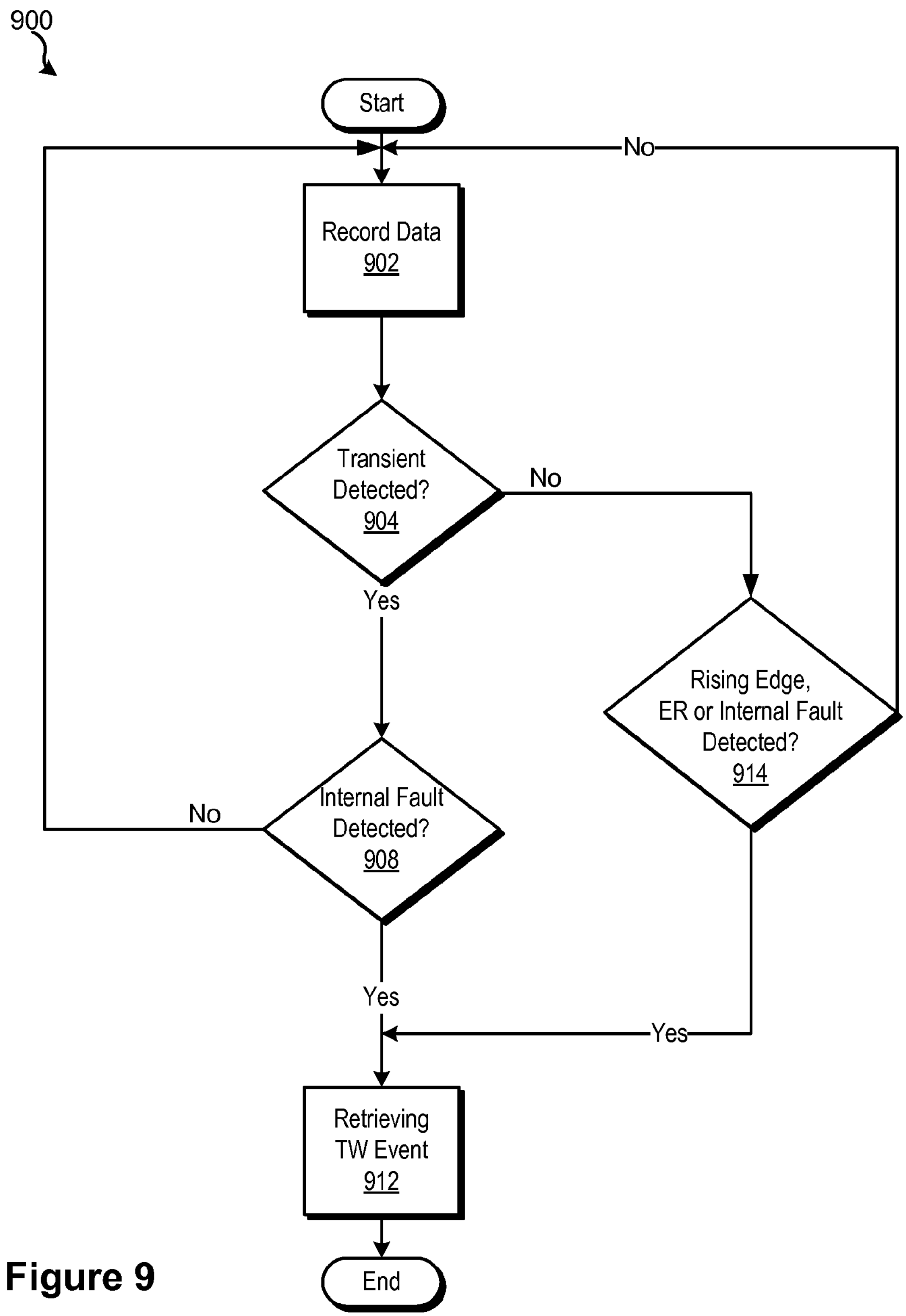
FIG. 9 illustrates a flowchart of a method for recording and retrieving traveling wave data that may be used in connection with various systems and methods disclosed herein for determining the location of a fault in an electric power delivery system using traveling waves.

FIG. 9 illustrates a flow chart of a method 900 for recording and retrieving traveling wave data that may be used in connection with various systems and methods disclosed herein for determining the location of a fault in an electric power delivery system using traveling waves. At 902, data recording may begin. In certain embodiments, the data may be recorded in a circular buffer. At 904, a determination may be made whether a transient is detected, for example, using a transient detector as illustrated in FIG. 5. If a disturbance is not detected, at 904, method 900 may determine whether a rising edge, event report (ER), or internal fault are detected at 914. If none of the conditions noted in 904 and 914 are detected, method 900 may return to 902. If a rising edge, ER, TRIG command, or an internal fault is detected, at 914, data recording is stopped and data associated with a traveling wave event may be retrieved at 912.

Upon a detection of a transient in 904, system 900 may determine whether an internal fault has been detected 908. If no internal fault is detected, method 900 may return to 902. If an internal fault is detected at 908, data associated with a traveling wave event may be retrieved at 912.

FIG. 10 illustrates an observation window generated by a triggering event. In the illustrated embodiment, the triggering event is the rising edge of a traveling wave. The observation window opens some period of time 1002 prior to the trigger event. According to some embodiments, the window prior to the triggering event 1002 may be a fixed time (e.g., 0.25 msec) or a variable time period (e.g., a multiple of MAXTT). The observation window also extends through for a period of time following the trigger event 1004. Again, the period of time 1004 may be a fixed time or a variable time period (e.g., a multiple of MAXTT).

Figure 11:
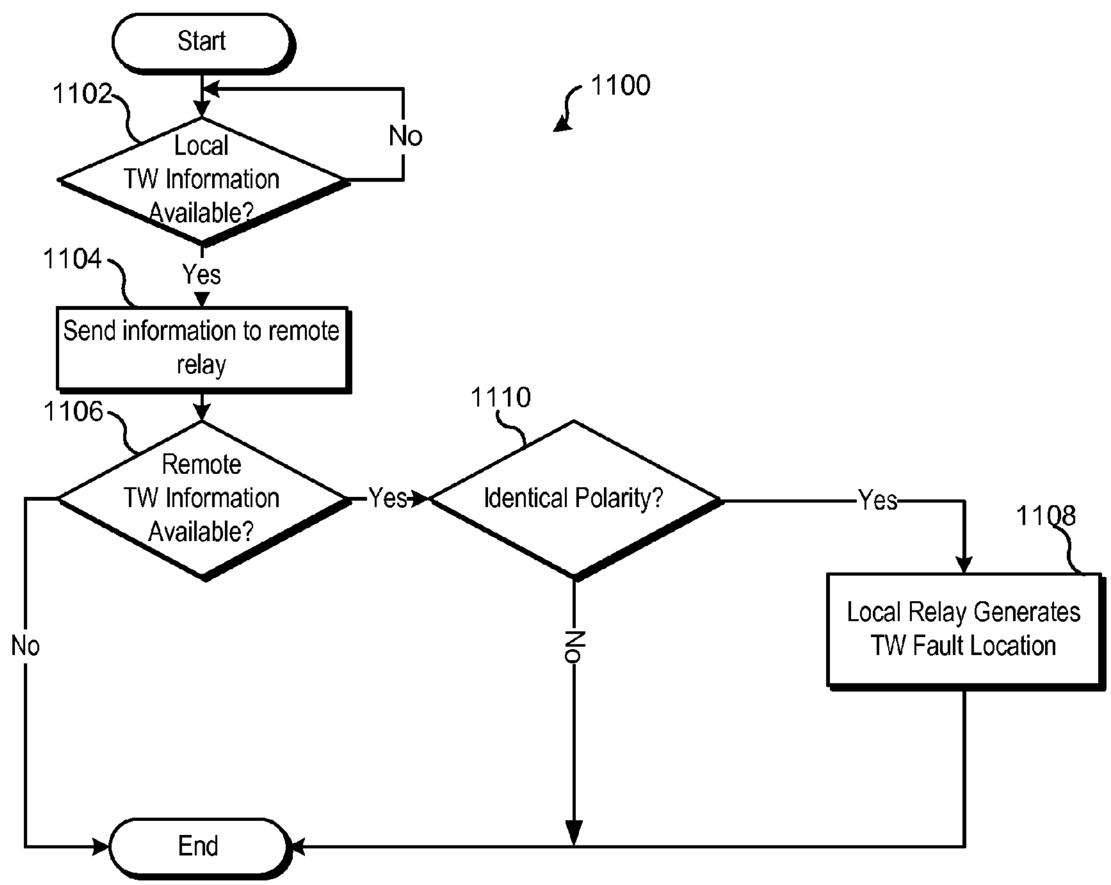
FIG. 11 illustrates a flowchart of a method for exchanging data between a local relay and a remote relay that may be utilized by various systems disclosed herein for determining the location of a fault in an electric power delivery system using traveling waves.

FIG. 11 illustrates a flowchart of a method 1100 for exchanging data between a local relay and a remote relay that may be utilized by various systems disclosed herein for determining the location of a fault in an electric power delivery system using traveling waves. In the illustrated embodiment, method 1100 may be performed by a local IED. A remote IED may perform a corresponding method that is similar to method 1100 in interaction with a local IED. The local IED and a remote IED may exchange information regarding a fault that occurs on a transmission line. In order to calculate a fault location, the remote IED and local IED may exchange various types of information. Such information may include:

Traveling wave value time stamps for each phase (TPKA, TPKB and TPKC);

Traveling wave polarities for each phase (PPKA, PPKB, and PPKC);

Traveling wave statuses for each phase (PKOKA, PKOKB, and PKOKC);

Faulted phase (TWSPL);

According to various embodiments, method 1100 may be performed without user intervention. In other words, method 1100 may be performed automatically by a system configured to monitor and/or protect an electric power delivery system. Further, such a system may be configured to automatically notify personnel responsible for the operation of the electric power delivery system of the occurrence of a fault and an estimated location of the fault.

Method 1100 may begin by determining if local traveling wave information is available (i.e., a traveling wave has been detected), at 1102. When local traveling wave information is available, at 1104 the local IED may send a request for traveling wave information to a remote relay. Alternatively, the remote relay may broadcast the traveling wave information, which is received by the local relay. At 1106, it may be determined whether the remote traveling wave information is available. If the remote traveling wave information is not available, the method may end. If the remote traveling wave information is available, the method may determine if the polarity of the local traveling wave information and the remote traveling wave information are identical 1110. That is, the traveling wave information may include peaks with either positive or negative polarities. If the polarities are not identical, then the method may end.

If the polarities are identical, the local IED may use the local traveling wave information and the remote traveling wave information in order to generate a fault location estimate at 1108. According to one embodiment, the location may be calculated using Eqs. 7-10.

$$\begin{aligned}&\text{IF}\\&PPKL \text{ and } PPKR \text{ have the same polarity}\\&\text{THEN}\\&TWFLL = \frac{LL + (TPKL - TPKR)\cdot VLINE}{2}\end{aligned} \quad \text{Eq. 7}$$

According to various embodiments, the IED may calculate the fault location in one or more ways depending on the amount of information available. If only local information is available the relay calculates the fault location as shown in Eq. 8. The calculation is shown only in phase A for a phase A to ground fault. Similar calculations may be made for additional phases.

$$FL_L = \frac{\mathrm{Im}[V_A * (I_{2L})^*]}{\mathrm{Im}(Z_{1L} * (I_A + k_0 * I_G) * (I_{2L})^*} \quad \text{Eq. 8}$$

where $V_A$ is the A-phase voltage;

$I_A$ is the A-phase current;

$I_G$ is the residual current;

$Z_{1L}$ is the positive-sequence line impedance;

$I_{2L}$ is the local negative-sequence current; and $k_0$ is the zero-sequence compensation factor.

If the remote current is available, the IED may calculate the fault location using Eq. 9.

$$FL_{L\&R} = \frac{\mathrm{Im}[V_A * (I_{2L} + I_{2R})^*]}{\mathrm{Im}(Z_{1L} * (I_A + k_0 * I_G) * (I_{2L} + I_{2R})^*} \quad \text{Eq. 9}$$

where $I_{2R}$ is the remote negative-sequence current

If the remote traveling wave information is available, the relay calculates the fault location using Eq. 10.

$$FL_{TW} = \frac{LL + (t_L - t_R)\cdot v}{2} \quad \text{Eq. 10}$$

where

LL is the line length;

$t_L$ is the time stamp of the local traveling wave value;

$t_R$ is the time stamp of the remote traveling wave value; and v is the line propagation velocity.

Although not specifically shown, the remote IED may also calculate the fault location using a method similar to method 1100. The fault location result may be directed to operators of an electric power delivery system.

After the first estimate fault location is generated, the local and remote terminals exchange these fault location estimations to determine the final fault location. According to one embodiment, the final location estimate may comprise an average of the fault location estimations of the local IED and the remote IED. The relay displays the information according to the highest priority. In certain embodiments, the priorities from highest to lowest are: traveling wave $FL_{TW}$, local and remote voltages and/or currents (double end) $FL_{L\&R}$, or local voltages and currents (single end) $FL_L$.

FIG. 12 illustrates a flowchart of a method 1200 for selecting one method for estimating the location of a fault from a plurality of available methods according to certain embodiments. At 1202, method 1200 may determine whether an internal fault has been detected. When a fault is detected, at 1204, method 1200 may determine whether the time of a traveling wave value is available for a remote IED. If the time of the traveling wave value is available from the remote IED, at 1210, an estimated fault location may be calculated using data associated with the traveling wave data. According to one embodiment, the estimated fault location may be calculated according to Eq. 10. If the time of the traveling wave value is not available from the remote IED, method 1200 may move to 1206.

At 1206, it may be determined if a remote phase current and/or voltage measurements are available. If so, an estimated fault location may be calculated using the local and remote measurements 1212. According to some embodiments, the estimated fault location may be calculated according to Eq. 9. If the measurements are not available from the remote IED, method 1200 may move to 1208.

At 1208, an estimated fault location may be calculated using only local information. According to one embodiment, the estimated fault location may be calculated according to Eq. 8.

Equation 11 illustrates that the traveling wave fault location is a function of line length, the time stamp of a local traveling wave value, a time stamp of a remote traveling wave value, and a line propagation velocity. According to one embodiment, line length can be calculated using reflections of a traveling wave. It has been observed that a traveling wave may reflect from a far end terminal of a conductor. According to this embodiment, a traveling wave may be initiated at a first end of a conductor by, for example, closing a breaker with the remote terminal open. The time at which the traveling wave is initiated is recorded. The traveling wave propagates along the conductor, is reflected at a remote terminal, and returns to the first end of the conductor, where it is detected by an IED such as an IED described herein. The time at which the IED detects the traveling wave is recorded, and the time for the traveling wave to propagate to the remote terminal, reflect, and return is recorded. The IED may use this time, along with the propagation velocity to calculate a line length. Equation 11 may be used to calculate line length:

$$LL = \frac{\Delta t \cdot v}{2} \qquad \text{Eq. 11}$$

where:

LL is the line length;

Δt is the time from initiation of the wave to the detection of the reflected traveling wave; and, v is the line propagation velocity.

Note that Δt can include several reflections to improve measurement accuracy.

Using the same method as line length calculation, the IED may calculate the fault location using traveling wave information from the local IED only. As described above, the local IED may detect and assign a first time stamp to a first traveling wave; detect and assign a second time stamp to a second reflected traveling wave; and calculate a time between the first and second time stamps. The IED may then calculate the distance to the fault along the conductor using the time difference and a line propagation velocity according to Equation 12:

$$FL_{TWL} = \frac{\Delta t \cdot v}{2} \qquad \text{Eq. 12}$$

where:

$FL_{TWL}$ is the fault location using local information;

Δt is the time from initiation to detection of the traveling wave; and, v is the line propagation velocity.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure. In particular, it should be noted that voltages may be used in the place of currents in certain embodiments. For example traveling wave voltages may be used instead of traveling wave currents.

What is claimed:

1. A receiving intelligent electronic device (IED) configured to calculate a fault location in electric power delivery system based on a traveling wave created by an electrical fault in the electric power delivery system, the receiving IED comprising:

a communications port;

control logic in communication with the communications port, the control logic configured to:

detect a transient traveling wave caused by an electrical fault by using a plurality of data samples representing measurements of a parameter of the electric power delivery system;

detect a first value of the transient traveling wave;

detect a first time associated with the first value;

receive via the communication port a second time associated with a second value of the transient traveling wave detected by a remote IED located at a known distance from the receiving IED; and generate an estimated fault location based on the time difference between the first time and the second time.

2. The receiving IED of claim 1, wherein the control logic is further configured to:

detect a first polarity of the transient traveling wave;

receive via the communication port a second polarity of the transient traveling wave; and when the first polarity is the same as the second polarity, generate the estimated fault location.

3. The IED of claim 1, wherein the first value comprises a first peak value, and the second value comprises a second peak value.

4. The IED of claim 1, wherein the first value comprises a first arrival time, and the second value comprises a second arrival time.

5. The receiving IED of claim 1, further comprising:
an input configured to receive current information from the electric power delivery system.

6. The receiving IED of claim 5, wherein the input is configured to receive the plurality of data samples representing measurements of the parameter of the electric power delivery system.

7. The receiving IED of claim 1, wherein the estimated fault location is generated without user intervention.

8. The receiving IED of claim 1, wherein the first time is compensated based on a delay associated with propagation of the transient traveling wave in a secondary cable of a known length in communication with the receiving IED.

9. The receiving IED of claim 8, wherein the second time is adjusted based on a delay associated with propagation of the transient traveling wave in a secondary cable of a known length in communication with the remote IED.

10. The receiving IED of claim 1, wherein the control logic is further configured to generate an estimated fault location based upon a negative-sequence current measurement received from the remote IED.

11. The receiving IED of claim 1, wherein the control logic is further configured to generate an estimated fault location based upon electrical parameters measurable from a single location in the electric power delivery system.

12. The receiving IED of claim 1, wherein the control logic further comprises a first order infinite impulse response filter, the first order infinite impulse response filter being configured to detect the transient traveling wave.

13. The receiving IED of claim 12, wherein the control logic further comprises a minimum threshold that is dependent on a noise level, and the minimum threshold is must be satisfied in order to detect the transient traveling wave.

14. The receiving IED of claim 1, wherein the control logic is further configured to:
generate an estimated fault location based upon a negative-sequence current and/or voltage measurement received from the remote IED;
generate an estimated fault location based upon electrical parameters measurable from a single location in the electric power delivery system; and,
select a fault location from the estimated fault locations.

15. The receiving IED of claim 1, wherein the estimated fault location is calculated according to:

$$FL_{TW} = \frac{LL + (t_L - t_R) \cdot v}{2},$$

wherein,
$FL_{TW}$ is the estimated fault location relative to a location of the IED;
$t_L$ is the first time;
$t_R$ is the second time;
v is the line propagation velocity; and
LL is the line length.

16. The receiving IED of claim 1, wherein the control logic is further configured to:
calculate the known distance by:
initiating a test traveling wave at the receiving IED;
generating a first test time upon initiating the test traveling wave;
receiving via the communication port a second test time associated with the test traveling wave detected by the remote IED;
calculate the known distance using a difference between the first test time and the second test time, and a line propagation velocity.

17. The receiving IED of claim 1, wherein the control logic is further configured to select a current signal from among a plurality of current signals.

18. An intelligent electronic device (IED) configured to calculate an estimated fault location in an electric power delivery system based on a traveling wave created by an electrical fault in the electric power delivery system, comprising:
a data bus;
a processor in communication with the data bus;
a non-transitory computer readable storage medium in communication with the data bus, the non-transitory computer readable storage medium comprising:
a traveling wave fault location estimation module configured to generate a fault location based on:
a first time associated with a first value of a transient traveling wave detected at a first location and caused by an electrical fault, and
a second time associated with a second value of the transient traveling wave detected at a second location a known distance from the first location;
a multi-end fault location estimation module configured to generate the fault location based on:
a first negative-sequence current measurement made at the first location, and
a second negative-sequence current measurement made at the second location; and
a single-end location fault location estimation module configured to generate the fault location based on electrical parameters measurable from a single location in the electric power delivery system;
wherein, the IED is configured to generate an estimated fault location using one of the traveling wave fault location estimation module, the multi-end fault location estimation module, and the single-end location fault location estimation module based upon available data.

19. The IED of claim 18, wherein the estimated fault location is generated without user intervention.

20. The IED of claim 18, wherein the traveling wave fault location estimation module, the multi-end fault location estimation module, and the single-end location fault location estimation module are each associated with a priority, and wherein the estimated fault location is calculated by the module having sufficient available data and having the highest priority.

21. A system for calculating a fault location on an electric power delivery system using a detected traveling wave created by an electrical fault in the electric power delivery system, comprising:
a communication medium between a first intelligent electronic device (IED) and a second IED;
the first IED comprising:
a first communications port in communication with the communication medium;
first control logic in communication with the first communications port and configured to:

detect a transient traveling wave caused by an electrical fault by using a first plurality of data samples representing measurements of a first parameter of the electric power delivery system;

detect a first value of the transient traveling wave;

detect a first time associated with the first value;

the second IED located a known distance from the first IED, the second IED comprising:

a second communications port in communication with the communication medium;

second control logic in communication with the second communications port and configured to:

detect the transient traveling wave caused by the electrical fault by using a second plurality of data samples representing measurements of a second parameter of the electric power delivery system;

detect a second value of the transient traveling wave;

detect a second time associated with the second value;

transmit the second time associated with the second value to the first IED;

wherein the control logic of the first IED is further configured to generate an estimated fault location based on the time difference between the first time and the second time.

22. The system of claim 21, wherein the control logic of the second IED is further configured to:

detect a second polarity of the transient traveling wave; and the control logic of the first IED is further configured to:

detect a first polarity of the transient traveling wave; and, when the first polarity is the same as the second polarity, generate the estimated fault location.

23. The system of claim 21, wherein the first value comprises a first peak value, and the second value comprises a second peak value.

24. The system of claim 21, wherein the first value comprises a first arrival value, and the second value comprises a second arrival value.

25. The system of claim 21, further comprising:

a common time source in communication with the first IED and the second IED;

wherein the first time and the second time are based the common time source.

26. The system of claim 25, where in a common time signal is distributed to at least one of the first IED and the second IED using the communication medium.

27. The system of claim 21, wherein the first time is adjusted based on a delay associated with propagation of the transient traveling wave in a secondary cable of a known length in communication with the first IED.

28. The system of claim 21, wherein the second time is adjusted based on a delay associated with propagation of the transient traveling wave in a secondary cable of a known length in communication with the second IED.

29. An intelligent electronic device (IED) for protection of a portion of an electric power delivery system, configured to calculate a fault location in the electric power delivery system based on a traveling wave created by an electrical fault in the electric power delivery system, the IED comprising:

a data bus;

a processor in communication with the data bus;

a non-transitory computer readable storage in communication with the data bus, the non-transitory computer readable storage medium comprising:

a protection element for determining a protection action for the portion of the electric power delivery system;

a traveling wave fault location estimation module configured to generate a fault location based on:

a first time associated with a first value of a transient traveling wave detected at a first location and caused by the electrical fault;

a second time associated with a second value of a transient traveling wave detected at the first location and caused by the electrical fault; and, a line propagation velocity;

wherein the fault location is used by the protection element.

30. The IED of claim 29, wherein the first value comprises a first peak value, and the second value comprises a second peak value.

31. The IED of claim 29, wherein the first value comprises a first arrival value, and the second value comprises a second arrival value.

32. The IED of claim 29, further comprising an input configured to receive current information from the electric power delivery system.

33. The IED of claim 29, wherein the first and second times are adjusted based on a delay associated with propagation of the transient traveling wave in a secondary cable of a known length in communication with the IED.

34. The IED of claim 29, wherein the traveling wave fault location estimation module is further configured to generate an estimated fault location based upon voltage and/or current measurements.

* * * * *